United States Patent [19]

McDonald

[11] Patent Number: 5,180,936
[45] Date of Patent: Jan. 19, 1993

[54] HIGH SPEED LOGIC CIRCUIT

[75] Inventor: James McDonald, Thousand Oaks, Calif.

[73] Assignee: Vitesse Semiconductor Corp., Camarillo, Calif.

[21] Appl. No.: 742,300

[22] Filed: Aug. 8, 1991

[51] Int. Cl.⁵ .......................................... H03K 19/094
[52] U.S. Cl. .................................. 307/348; 307/263; 307/554; 307/565; 307/568
[58] Field of Search ............... 307/540, 546, 548, 554, 307/561, 565, 568, 263

[56] References Cited

U.S. PATENT DOCUMENTS

| | | | |
|---|---|---|---|
| 4,096,398 | 6/1978 | Khaitan | 307/568 X |
| 4,543,494 | 9/1985 | Wakimoto | 307/548 X |
| 4,935,647 | 6/1990 | Larkins | 307/450 |
| 4,958,132 | 9/1990 | Plants | 307/548 X |

*Primary Examiner*—Eugene R. LaRoche
*Assistant Examiner*—Do Hum Yoo
*Attorney, Agent, or Firm*—Robert A. Seldon

[57] ABSTRACT

An improved GaAs switching device is disclosed, of the type having a switched clamp which shunts pull-up current except during a portion of a "0" to "1" transition at the device's output. The device herein provided enhanced immunity to interconnect resistance by isolating the gate-to-source Schottky diode of the clamp's FET from the device's output node. In accordance with the invention, the gate-to-source current through the clamp's FET is limited by an impedance device in the FET's gate circuit to provide the isolation.

4 Claims, 1 Drawing Sheet

HIGH SPEED LOGIC CIRCUIT

This invention relates to Group III–V semiconductor devices and, more particularly, to gallium arsenide integrated circuits.

BACKGROUND OF THE INVENTION

U.S. Pat. No. 4,935,647 (issued Jun. 19, 1990) is directed to a GaAs device having a current-injecting circuit that generates an initial pulse of capacitor-charging current during a "0"-to "1" output transition. The pulse is sufficiently large to quickly charge the parasitic capacitances, and is of sufficiently brief duration so that the minimum line width of the interconnect metal is substantially equal to that which would be applicable in the absence of the current-injecting circuit. The circuit is described as useful as an available macro for a GaAs array.

FIG. 1 herein schematically illustrates an embodiment of the above-described circuit which is illustrated and described in U.S. Pat. No. 4,935,647. U.S. Pat. No. 4,935,647 is assigned to the assignee of this invention, and the content of that patent is hereby incorporated by reference. The circuit comprises an inverter 10 which includes an enhancement mode (E-mode) pull-down FET 1 having its source "s" coupled to a power bus ($V_{SS}$), and its drain "d" coupled to the other power bus $V_{DD}$ through a pull-up resistive element in the form of a second FET 2. The output of the inverter is the drain "d" of the FET 1, while the input to the inverter is applied to the gate "g" of the FET 1. The resistive element is conveniently a depletion mode (D-mode) FET having its drain "d" tied to the power bus "$V_{DD}$", and its source "S" and gate "g" tied to the drain "d" of the E-mode FET 1. The respective width-to-length ratio of the channel of each FET is indicated in FIG. 1 by the nomenclature "W/L", where W and L are the numerical values of the ratio.

The output of the inverter is coupled to a push-pull buffer comprising a pull-down E-mode FET 4 in series with a resistive device in the form of a D-mode FET 3. The gate of the pull-up D-mode FET 3 is coupled to the drain of the inverter's pull-down FET 1 at an internal node 6. The output of the buffered inverter $V_o$ is the drain of the buffer's pull-down FET 4.

A clamp 8 responsive to the output $V_o$ of the buffered inverter selectively couples the internal node 6 to the power bus $V_{SS}$ to shunt pull-up drain-to-source current from the inverter's pull-up FET 2 to the bottom rail $V_{SS}$. The clamp shunts the current in this manner except for substantially all of the transition period when the output $V_o$ is changing from logic "0" to logic "1".

The clamp 8 comprises an E-mode FET 5 whose drain-to-source path is series-coupled with a diode D1 between the internal node 6 and the power bus $V_{SS}$. The gate of FET 5 is coupled to the buffer output $V_o$. The diode may conveniently be the Schottky diode of a FET on the chip.

As a change from "1" to "0" occurs at the input gate of the pull-down FET 1, the voltage at the internal node 6 rises faster than the voltage of the buffer's output $V_o$, heavily biasing the buffer's D-mode FET 3, and reducing the rise time of the buffer's output $V_o$. As the buffer's output $V_o$ approaches a logic level "a", the FET 5 of the clamp 8 begins to conduct, returning the internal node to a voltage level approximately equal to a diode drop (0.7 volts) above the power bus $V_{SS}$.

In practice, particularly in VLSI chip design, the various interconnect metal lines present on the chip can be long enough to exhibit an electrical resistance sufficient to affect the operation of the chip's components. For example, the power bus voltage may vary slightly between gates relatively near the power input to the chip and macros relatively remote from the power input, resulting in excessive current flow through the gate-to-source Schottky barrier diode of the E-mode FET 5. Such excessive current flows can exceed the electromigration current limits of the chip.

Similarly, a relatively long interconnect between a driver and a driven gate can result in excessive currents in the driver and/or degradation in the biasing of the driven element. By way of illustration, the reader's attention is directed to FIG. 2, which schematically illustrates the circuit of FIG. 1 with the addition of a schematically represented load. In FIG. 2, the capacitor C represents the total load capacitance, which comprises the capacitance of the driven devices (represented here by FET 9) and the capacitance of the interconnect metalization. The diode $D_2$ represents the gate-to-source Schottky barrier diode of the driven device FET 9. The resistor R represents the resistance of the metal interconnect line. $V_n$ represents the offset in $V_{ss}$ of the driven device FET 9 due to the IR drops on the $V_{ss}$ line. The diode $D_3$ represents the gate-to-source Schottky diode of FET 5.

It can be appreciated from FIG. 2 that the biasing of the driven device FET 9 is degraded if the interconnect line is of such length that resistor R has a significant value, or if the polarity of $V_n$ is such that the gate-to-source voltage of the driven device FET 9 is reduced. This happens because the output voltage of the buffer $V_o$ is clamped by diode $D_3$ and the voltage drop across R, or $V_n$, reduces the voltage to the gate of the driven device FET 9.

Moreover, the presence of the resistance R can cause a large amount of current to flow through the gate and source of FET 5, exceeding the electromigration current limits, if FET 3 and FET 4 are sized to provide a large transient current to the load capacitor C.

SUMMARY OF THE INVENTION

The invention herein is an improved GaAs circuit, useful with inverters and NOR gates, having enhanced immunity to interconnect resistance. Briefly, the circuit includes first and second power bus means, a GaAs pull-down FET serially coupled via its drain and source between the two power bus means to a pull-up impedance element, the pull-down FET having a gate for receiving an input logic signal. The circuit further comprises a buffer including a pair of GaAs FETs serially connected via their sources and drains between the two power bus means. One of the buffer FETs has a gate coupled to the junction between the circuit's impedance element and pull-down FET. The other buffer FET has a gate receiving the input logic signal. The output of the circuit is the node between the two buffer FETs.

The disclosed circuit further includes a switched clamp circuit which includes an FET coupled in series with diode means via its source and drain between said junction and said second power bus. The gate of the clamp FET is coupled to said node through a resistor device, such as a depletion-mode transistor with its gate and source shorted together. The resistor device isolates the gate-to-source Schottky diode of the clamp FET from the output node to minimize the clamping effect of $D_3$ and also limits the current flowing into the gate of the clamp's FET 5, thereby substantially reducing the possibility of the bias degradation and electromigration described above.

Additional details concerning the invention will be apparent from the following description of the preferred embodiment, of which the following drawings is a part.

DESCRIPTION OF THE PREFERRED EMBODIMENT

Figure 1:
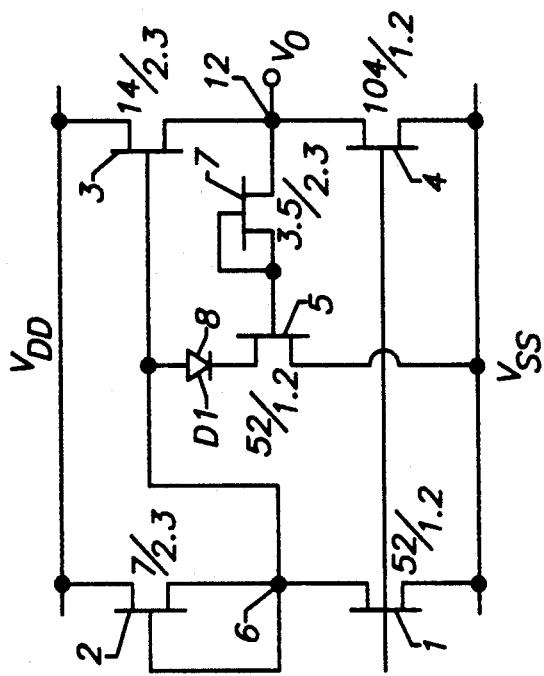
FIG. 1 is schematic illustration of a buffered GaAs inverter illustrated and described in U.S. Pat. No. 4,935,647.
Figure 3:
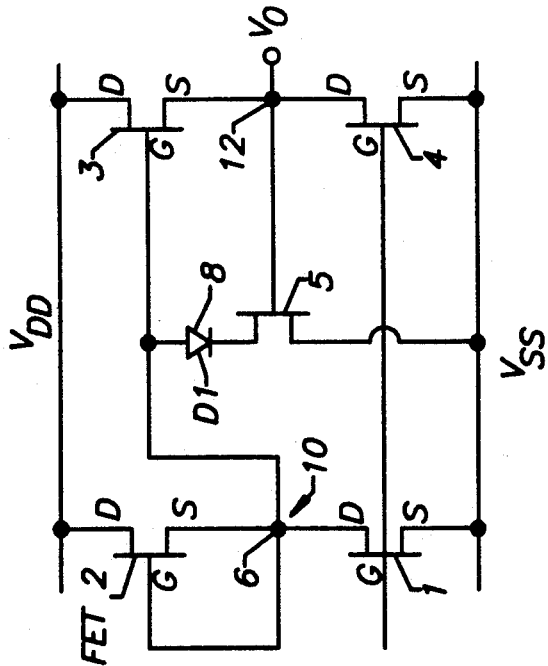
FIG. 3 is a schematic illustration of a buffered GaAs inverter constructed in accordance with the invention herein.
Figure 2:
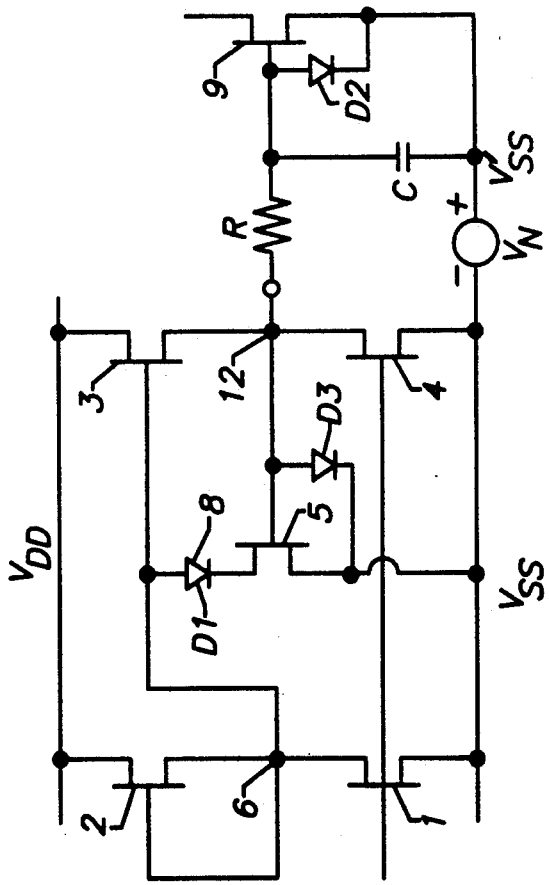
FIG. 2 is a graphic illustration of the buffered inverter of FIG. 1, together with a schematically illustrated load.

Referring to FIG. 3, a preferred embodiment of a buffered inverter is illustrated as comprising first and second power bus means $V_{SS}$, $V_{DD}$, and a GaAs pull-down FET 1 serially coupled via its drain and source between the two power bus means to a pull-up impedance element FET 2, the pull-down FET 1 having a gate "g" for receiving an input logic signal. The buffered inverter further comprises a buffer circuit including a pair of GaAs FETs 3, 4 serially connected via their sources and drains between the two power bus means. One of the buffer FETs 3 has a gate "g" coupled to the junction 6 between the inverter circuit's impedance element and pull-down FET. The other buffer FET 4 has a gate "g" receiving the input logic signal. The output of the buffered inverter is at the node 12 between the two buffer FETs.

The buffered inverter further includes a switched clamp circuit 8 which comprises an FET 5 coupled via its source and drain between said junction 6 and said second power bus $V_{SS}$ in series with diode means D1. The gate "g" of the clamp FET 5 is coupled to said node 12 through a resistor device 7, such as a depletion-mode transistor with its gate and source shorted together. The resistor device 7 isolates the gate-to-source Schottky diode $D_3$ of the clamp FET 5 from the output node 12, limiting the current flowing into the gate of the clamp's FET 5, and thereby substantially reducing the possibility of the bias degradation and electromigration.

In FIG. 3, the respectively preferred width-to-length ratios of each FET's channel is indicated by the nomenclature "W/L", wherein W and L are the numerical values of the ratio.

While the foregoing description includes detail which will enable those skilled in the art to practice the invention, it should be recognized that the description is illustrative in nature and that many modifications and variations will be apparent to those skilled in the art having the benefit of these teachings. It is accordingly intended that the invention herein be defined solely by the claims appended hereto and that the claims be interpreted as broadly as permitted in light of the prior art.

I claim:

1. A high speed logic circuit comprising:
   first and second power bus means;
   first resistor means;
   first pull-down GaAs transistor means having gate means and a pair of main electrode means, the transistor means being coupled between the first and second power bus means in series with the resistor means via its pair of main electrode means, the output from the transistor means being produced at a selected one of its main electrode means, the transistor means producing an output logic level signal at its output in response to a logic level input signal at its gate means;
   push-pull buffer means responsive to the input signal to provide an output signal from the circuit, the push-pull buffer means minimizing the rise time associated with the transition of the transistor means output; and
   switched clamp means including second GaAs transistor means and diode means, the second transistor means having gate means being a pair of main electrode means, the second transistor means being coupled via its pair of main electrode means in series with the diode means between the output of the first transistor means and the second power bus means so as to divert current from the first resistor means to the second power bus means when turned on by a sufficient signal level applied to its gate means,
   the switched clamp means further including resistor means coupled between the circuit output and the gate means of the second transistor means to limit current flow to the second transistor means' gate means from the circuit output.

2. The circuit of claim 1 wherein the resistor means is sized to permit just enough current to flow to the second transistor means' gate means to turn the second transistor means on, except during at least a substantial portion of a rising transition of the buffer means' output.

3. The circuit of claim 1 wherein the resistor means comprises a GaAs transistor device having gate means and a pair of main terminal means, its gate means being coupled to one of its main terminal means.

4. A circuit comprising:
   first and second power bus means;
   a first depletion mode GaAs transistor having a pair of main terminal means and gate terminal means electrically coupled to one of its main terminal means at a first node to form a first active impedance element; the other of the main terminal means being coupled to the first power bus means;
   a first enhancement mode GaAs transistor having one of a pair of main terminal means electrically coupled to the first node and the other of the pair of main terminal means electrically coupled to the second power bus means, the first enhancement mode GaAs transistor further having gate terminal means available to receive an input logic level signal to the circuit;
   a second depletion mode GaAs transistor having one of a pair of main terminal means electrically coupled to the first bus means,
   a second enhancement-mode GaAs transistor having one of a pair of main terminal means electrically coupled to the second bus means and the other of the pair of the main terminal means electrically coupled to the other main terminal of the second depletion mode GaAs transistor to define a circuit output terminal;

GaAs diode means having anode terminal means electrically coupled to the first node and further having cathode terminal means;

a third depletion mode GaAs transistor having a pair of main terminal means and gate terminal means electrically coupled to one of its main terminal means to form a second active impedance element, the other of the main terminal means being coupled to the circuit output terminal; and a third enhancement-mode GaAs transistor having gate terminal means coupled through the second active impedance to the circuit output, and a pair of main terminal means respectively electrically coupled to the cathode terminal means and the second power bus means.

* * * * *